(12) United States Patent
Choi

(10) Patent No.: US 6,972,496 B2
(45) Date of Patent: Dec. 6, 2005

(54) CHIP-SCALED PACKAGE HAVING A SEALED CONNECTION WIRE

(75) Inventor: Shin Choi, Chungcheongbuk-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/159,348

(22) Filed: May 31, 2002

(65) Prior Publication Data
US 2002/0185719 A1 Dec. 12, 2002

(30) Foreign Application Priority Data
Jun. 12, 2001 (KR) .............................. 2001-32873

(51) Int. Cl.[7] .................. H01L 23/48; H01L 23/52; H01L 29/40
(52) U.S. Cl. ...................... 257/780; 257/784
(58) Field of Search ................. 257/780, 784

(56) References Cited

U.S. PATENT DOCUMENTS

| | | | |
|---|---|---|---|
| 4,905,075 A | 2/1990 | Temple et al. | |
| 5,884,396 A | 3/1999 | Lin | |
| 6,080,494 A | 6/2000 | Abbott | |
| 6,133,072 A * | 10/2000 | Fjelstad | 438/128 |
| 6,211,461 B1 * | 4/2001 | Park et al. | 174/52.4 |
| 6,215,670 B1 * | 4/2001 | Khandros | 361/774 |
| 6,476,503 B1 * | 11/2002 | Imamura et al. | 257/780 |
| 2003/0107131 A1 * | 6/2003 | Higashi et al. | 257/735 |

FOREIGN PATENT DOCUMENTS

| | | | |
|---|---|---|---|
| EP | 0997 939 A1 * | 5/2000 | |
| JP | 59 025256 | 2/1984 | |
| JP | 60 147146 | 8/1985 | |
| JP | 60 261185 | 12/1985 | |
| JP | 03 076401 | 4/1991 | |
| JP | 04 006893 | 1/1992 | |
| JP | 09 237852 | 9/1997 | |
| JP | 10 214918 | 8/1998 | |
| JP | 2000-200804 | * 7/2000 | |

* cited by examiner

*Primary Examiner*—Howard Weiss
(74) *Attorney, Agent, or Firm*—Ladas & Parry LLP

(57) ABSTRACT

A chip-scaled package and manufacturing method thereof including a semiconductor chip having a chip pad thereon, a first insulating layer formed on the semiconductor chip and having an opening part exposing the chip pad, a metal wire of which one end covers the opening part so as to be electrically connected to the chip pad 202, a second insulating layer on the first insulating layer including the opening part, the second insulating layer exposing the other end of the metal wire, a conductive ball formed on the other end of the exposed metal wire, and a substrate on which the ball is to be mounted, thereby enabling to improve a package reliance by decreasing the scale and weight of the package.

10 Claims, 8 Drawing Sheets

CHIP-SCALED PACKAGE HAVING A SEALED CONNECTION WIRE

BACKGROUND OF THE INVENTION

1. Field of the Invention

The present invention relates generally to a package and a manufacturing method thereof, and more particularly, to a chip-scaled package and manufacturing method thereof enabling improved package reliance by decreasing the scale and weight of the package.

2. Background of the Related Art

As widely known, each of the chips fabricated by growing films on a wafer is separated from the wafer by sawing and then molded and protected by shielding so as to provide a packaged product (hereinafter abbreviated as a package) protected from external atmosphere containing moisture and impurities. The package also requires leads to be electrically connected to external circuits outside the package.

A chip-scaled package molded to a size similar to the space occupied by the chip itself is a micro device that comprises a valuable commodity. Such packages are very useful for increasing the mounting density on a circuit board as well as integrated density of various integrated circuits, such as ASIC (application specific integrated circuits).

FIG. 1 illustrates a cross-sectional view of a known chip-scaled package, and FIG. 2 illustrates a partially cutaway, perspective view of a known chip-scaled package.

Referring to FIGS. 1 and 2, a chip-scaled package according to the known art is constructed with a semiconductor chip 100 on which a plurality of chip pads 102 are formed. A first insulating layer 104 is formed on the semiconductor chip 100, the first insulating layer 104 having a first opening part 105 exposing each of the chip pads 102. A second insulating layer 106 is formed on the first insulating layer 104, the second insulating layer 106 having a second opening part 107 corresponding to the first opening part 105. A metal line 108 is deposited over the second insulating layer 106 covering the second opening part 107, and having a ball land 111 at a portion of an extension of the metal line 108. A micro-spring type metal wire 114 is formed on the ball land 111, a plating layer 112 is formed on the metal line 108 and on the metal wire 114. The semiconductor chip 100 is attached to a substrate 120 by means of the metal wire 114 being attached to a solder 118 inserted between the metal wire 114 and substrate 120.

FIGS. 3A to 3D illustrate cross-sectional views of steps of manufacturing a conventional chip-scaled package.

Referring to FIG. 3A, first, a PIQ (Polyimide Isoindro-Quinazoline) layer is coated on a semiconductor chip 100. A first insulating layer 104, having a first opening part 105, is then formed by patterning the PIQ layer so as to expose a portion of the chip pad 102 disposed on the semiconductor chip 100. In this case, a passivation layer (not shown) is formed on a plurality of the chip pads 102 and between the chip pads 102 on the semiconductor chip 100.

Referring to FIG. 3B, a second PIQ layer is coated on the first insulating layer 104. A second insulating layer 106 having a second opening part 107, corresponding to the first opening part 105, is then formed by patterning the PIQ layer so as to expose the first opening part 105. In this case, the second insulating layer 106 has a construction such that the chip pad 102 is exposed by the second opening part 107.

Referring to FIG. 3C, TiW and Au are deposited on the second insulating layer 106 successively by sputtering. A metal line 108 consisting of TiW 108a and Au 108b is formed by patterning the TiW and Au so as to cover the chip pad 102.

In this case, the metal line 108 has a trace (not shown) connecting a ball land 111/chip pad 102 and ball land 111. Moreover, the deposition of the TiW 108a and Au 108b constructing the metal line 108 is carried out in a separate deposition chamber (not shown). Referring to FIGS. 2 and 3D, a metal wire 114 is formed on the ball land 111 of the metal line 108. In this case, an end of the metal wire 114 contacted with the metal line 108 is formed of a gold (Au) based material and being patterned to have a cudgel shape. A plating layer 112 is formed on the metal line 108 and on the wire 114. In this case, the plating layer 112 is formed of Ni.

Then, the metal wire 114 is attached to a substrate 120 (not shown in FIG. 3D) using a solder 118, similar to that shown in FIGS. 1 and 2.

Unfortunately, the chip-scaled package made according to this conventional method has the structure that the metal wire used for electrical connection is exposed, thereby being vulnerable to chemicals or moisture, and furthermore results in difficulty in controlling the package thickness. Moreover, such conventional packages are easily separated from a semiconductor chip or a substrate due to the weak attachment of the metal wire, thereby producing a mechanical stress to cause deformation, which deformation may bring about an electrical short circuit.

Moreover, the method according to the related art requires a sputtering process in a separate deposition chamber for forming a metal line, thereby complicating the package manufacturing process.

SUMMARY OF THE INVENTION

Accordingly, the present invention is directed to a chip-scaled package and manufacturing method thereof that substantially obviates one or more of the problems due to limitations and disadvantages of the related art.

The object of the present invention is to provide a chip-scaled package enabling reinforcement of the bonding intensity of a metal wire.

Another object of the present invention is to provide a method of manufacturing a chip-scaled package enabling easier control over the package thickness, as well as simplifying the manufacturing process.

Additional features and advantages of the invention will be set forth in the description which follows, and in part will be apparent from the following detailed description, or may be learned by practice of the invention. The objectives and other advantages of the invention will be realized and attained by the structure particularly pointed out in the written description and claims hereof, as well as from the appended drawings.

To achieve these and other advantages, and in accordance with the purpose of the present invention as embodied and broadly described, a chip-scaled package according to the present invention includes a semiconductor chip having a chip pad thereon, a first insulating layer formed on the semiconductor chip and having an opening part exposing the chip pad, a metal wire, one end of which covers the opening part and providing and electrical connection to the chip pad, a second insulating layer disposed on the first insulating layer including over the opening part, the second insulating layer exposing the other end of the metal wire, a conductive ball formed on the other end of the exposed metal wire, and a substrate for mounting the semiconductor chip thereon by means of the conductive ball.

In another aspect of the present invention, a method of manufacturing a chip-scaled package includes the steps of providing a semiconductor chip having a chip pad thereon, forming a first insulating layer on the semiconductor chip, the first insulating layer having an opening part exposing the chip pad, forming a metal wire, one end of which covers the opening part so as to be electrically connected to the chip pad, forming a second insulating layer on the first insulating layer including the opening part, the second insulating layer exposing the other end of the metal wire, and forming a conductive ball on the other end of the exposed metal wire.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
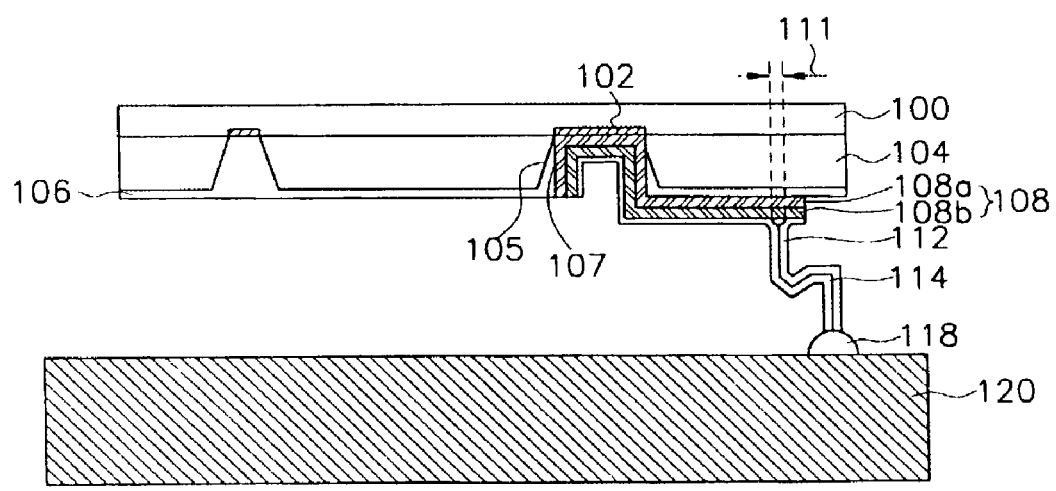
FIG. 1 illustrates a cross-sectional view of a conventional chip-scaled package.
Figure 2:
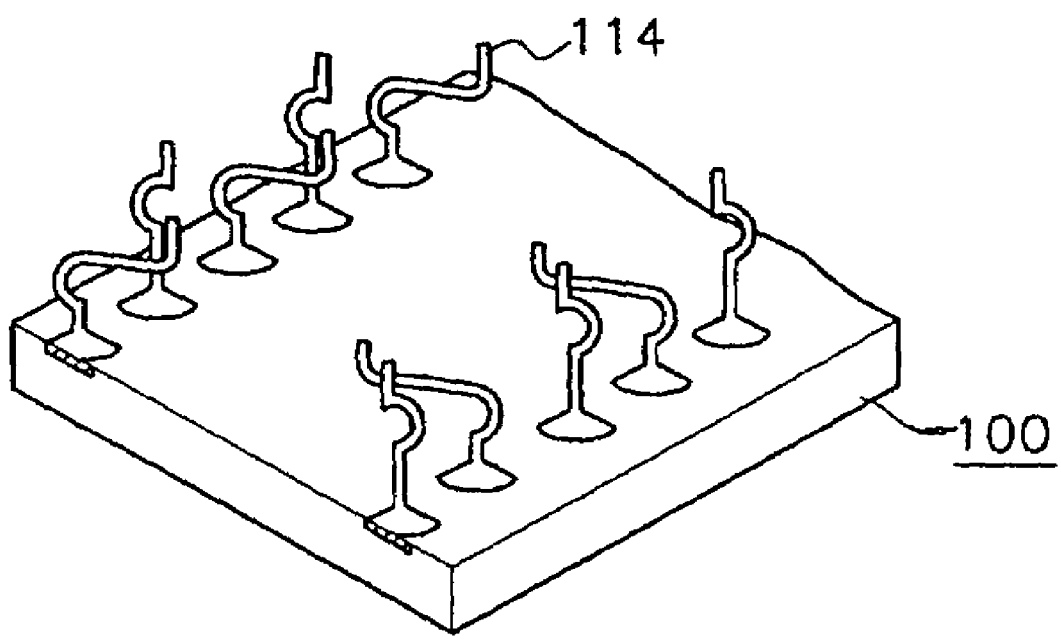
FIG. 2 illustrates a partially cut-away, perspective view of a conventional chip-scaled package.
Figure 3A:
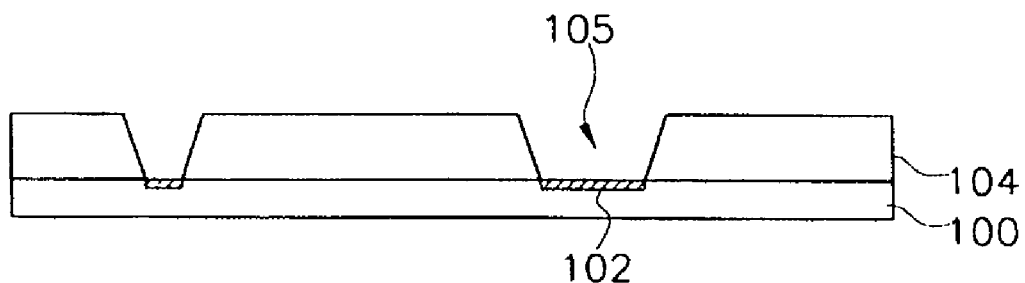
FIGS. 3A to 3D illustrate cross-sectional views of the steps of manufacturing a conventional chip-scaled package.
Figure 3B:
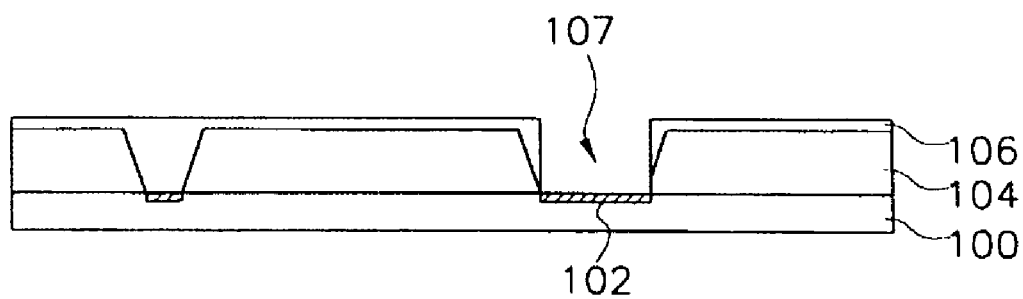
Figure 3C:
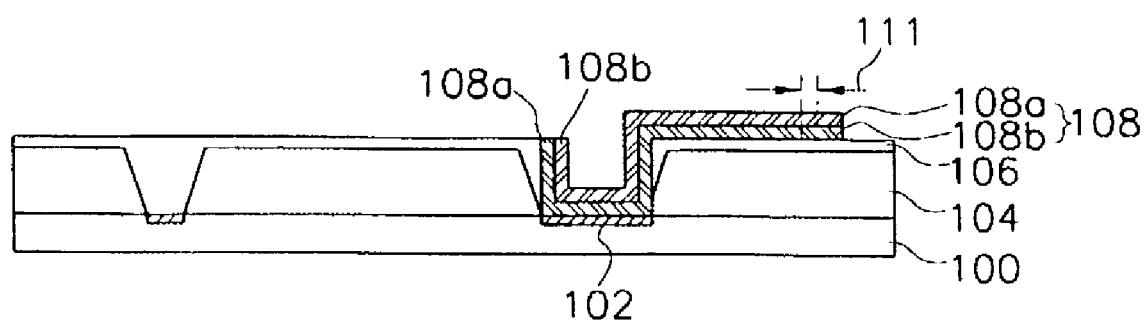
Figure 3D:
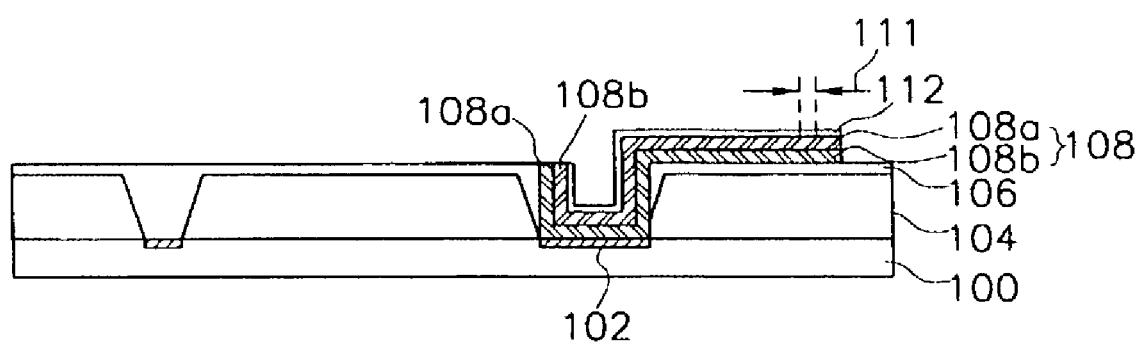

Reference will now be made in detail to the preferred embodiments of the present invention, examples of which are illustrated in the accompanying drawings. Where possible, the same reference numerals will be used to illustrate like elements throughout the specification.

Figure 4:
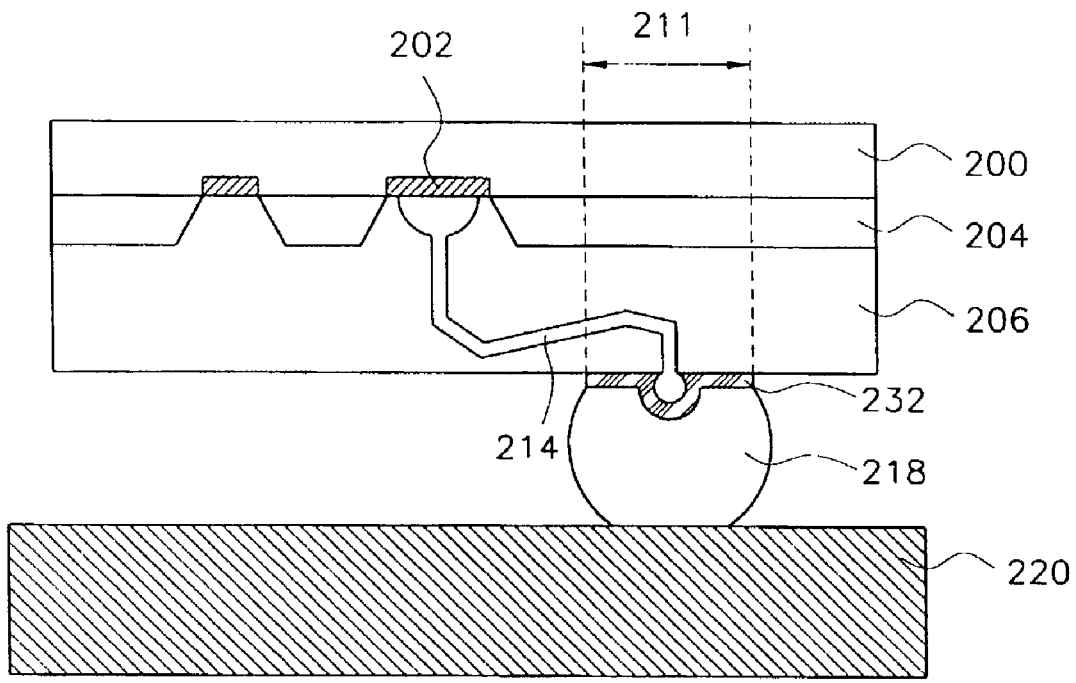
FIG. 4 illustrates a cross-sectional detailed view of a chip-scaled package according to the present invention.
Figure 5:
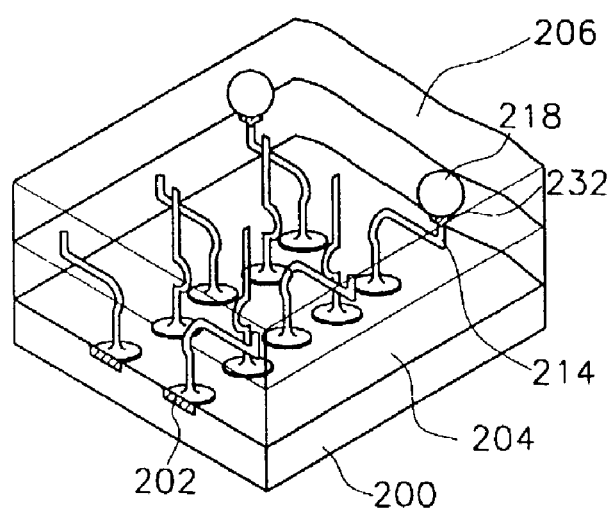
FIG. 5 illustrates a partially cut-away, perspective view of a chip-scaled package according to the present invention.

FIG. 4 illustrates a cross-sectional view of a chip-scaled package according to the present invention and FIG. 5 illustrates a partially cut-away, perspective view of a chip-scaled package according to the present invention. Referring to FIG. 4, a chip-scaled package according to the present invention is constructed with a semiconductor chip 200 having a plurality of chip pads 202, a first insulating layer 204 being formed on the semiconductor chip 200 and first insulating layer 204 having an opening part 205 exposing the chip pad 202. An electrical connection is provided by a metal wire 214, of which one end covers the opening part 205 so as to be electrically connected to the chip pad 202. A second insulating layer 206 is formed on the first insulating layer 204 covering the opening part 205 but exposing the other end of the metal wire 214. A Cu layer pattern 232 covers the other end of the metal wire 214 and a microspring type solder ball 218 is formed on the Cu layer pattern 231, and makes electrical connection with a substrate 220, on which the solder ball 218 is mounted.

FIGS. 6A to 6G illustrate cross-sectional views of the steps of manufacturing a chip-scaled package according to the present invention.

Figure 6A:
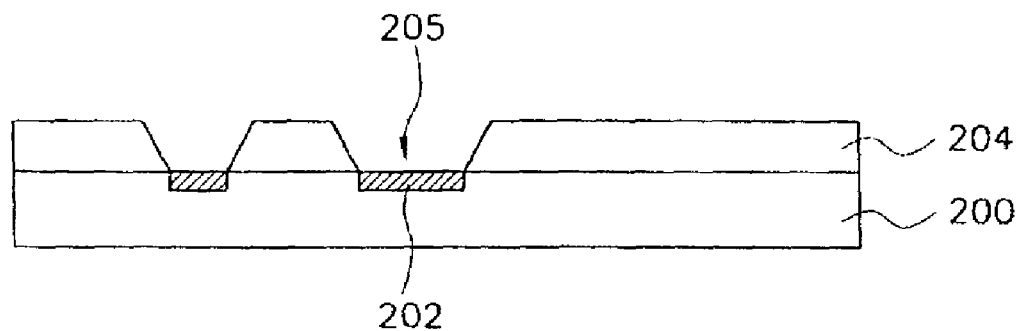
FIGS. 6A to 6G illustrate cross-sectional views of the steps of manufacturing a chip-scaled package according to the present invention.

Referring to FIG. 6A, first, a PIQ (polyimide isoindroquinazoline) layer is coated on a semiconductor chip 200. A first insulating layer 204 having an opening part 205 is then formed by patterning the PIQ layer so as to expose the chip pad 202. In this case, a passivation layer (not shown) is formed on a plurality of the chip pads 202 and between the chip pads on the semiconductor chip 200.

Figure 6B:
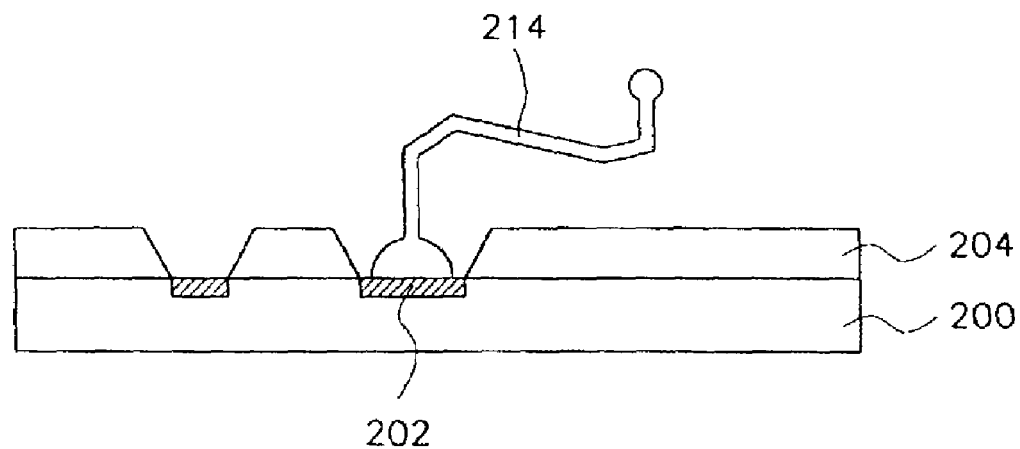

Referring to FIG. 6B, a metal wire 214 is formed by covering the opening part 205 so as to be electrically connected to the chip pad 202. In this case, one end of the metal wire 214 is electrically connected to the chip pad 202 by covering the opening part 205, while the other end of the metal wire 214 is exposed above the first insulating layer 204. Moreover, both ends of the metal wire 214 are preferably ball shapes and are formed of Cu or Au.

Figure 6C:
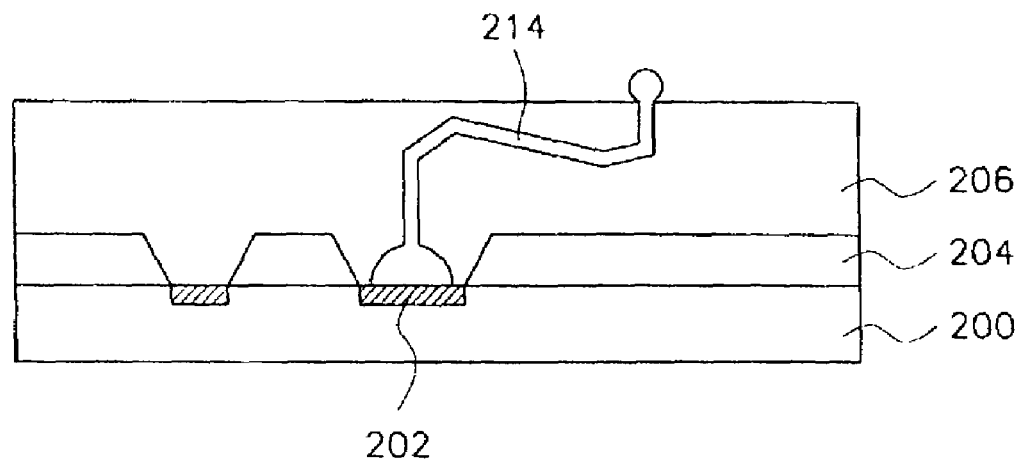

Referring to FIG. 6C, an epoxy or silicon rubber based sealing material is coated on the first insulating layer 204. A second insulating layer 206 is then formed by selectively etching the sealing material so as to expose the other end of the metal wire 214. In this case, the second insulating layer 206 is formed to a thickness of from 250 to 300 $\mu$m.

Figure 6D:
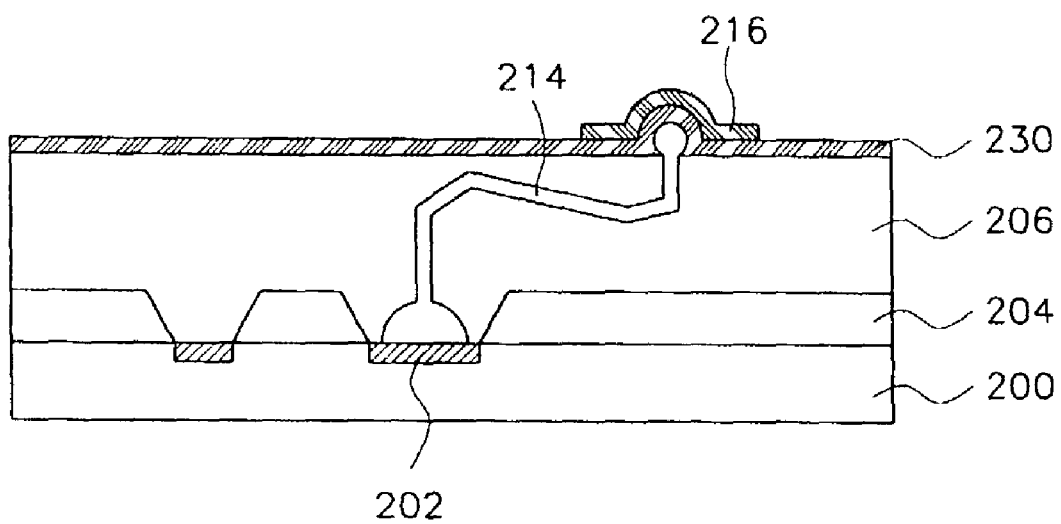

Referring to FIG. 6D, a Cu layer 230 is deposited on the second insulating layer 206 by sputtering to a thickness of from 5 to 10 $\mu$m. Subsequently, the Cu layer 230 is coated with a photoresist layer (not shown) A photoresist pattern 216 is then formed by removing the photoresist layer selectively by exposure and development so that the photoresist pattern 216 covers the other end of the metal wire 214 having a ball shape.

Figure 6E:
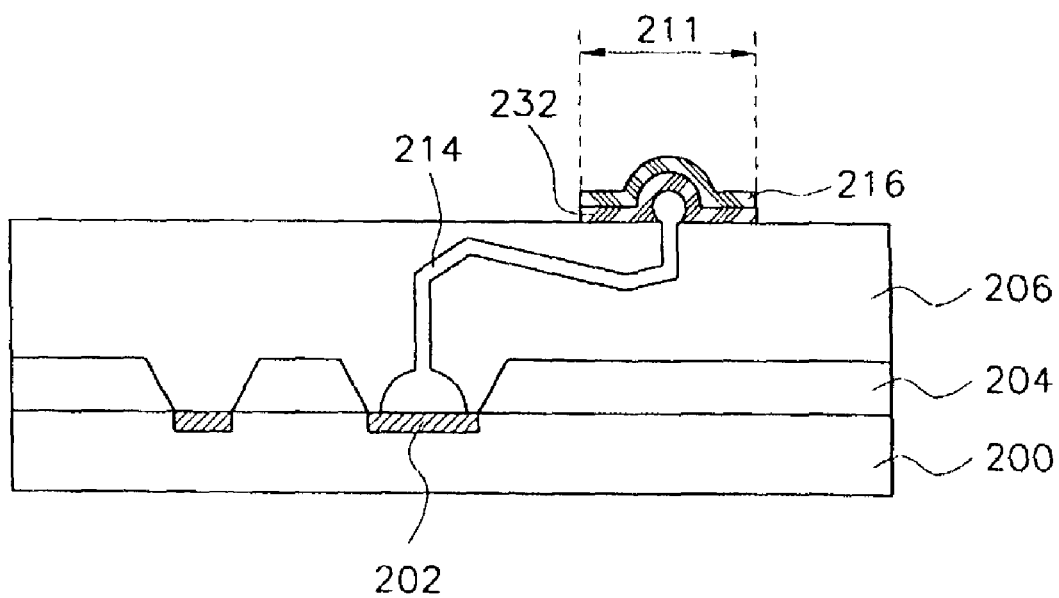

Referring to FIG. 6E, a Cu layer pattern 232 is formed by etching the Cu layer 230 using the photoresist pattern 216 as a mask. In this case, the Cu pattern 232 is electrically connected to the chip pad 202 through the metal wire 214 and becomes a ball land on which a solder ball is mounted later through a succeeding process step.

Moreover, the Cu pattern 232 is patterned to cover the other end of the metal wire 214 having a ball-like shape, thereby increasing the contact area 211 between the metal wire 214 and the solder ball.

Figure 6F:
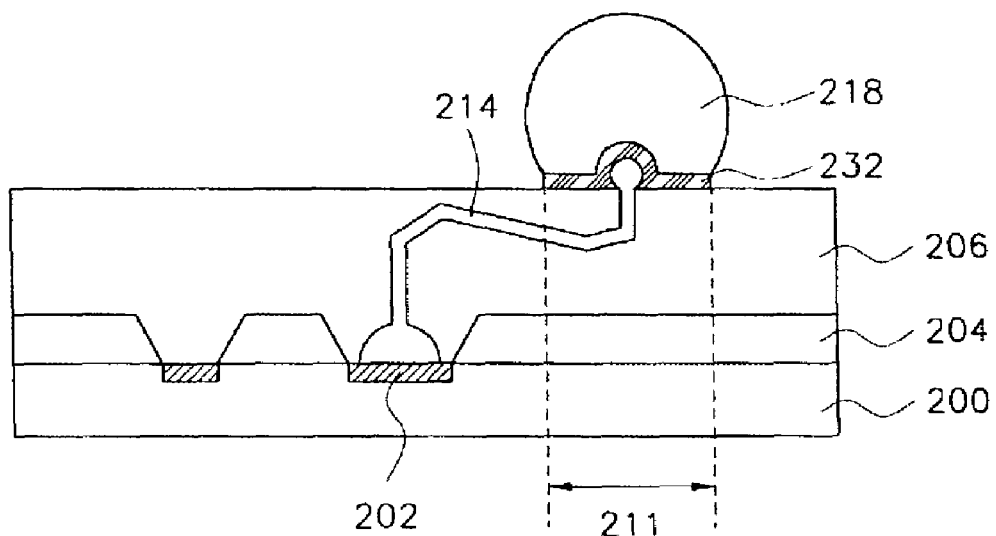

Referring to FIG. 6F, the photoresist pattern is removed. A solder (not show) is put on a stencil (not shown). A solder ball 218 is then formed by reflowing the solder at a temperature of between 200 to 250° C. so as to be electrically connected to the Cu layer pattern 232. In this case, the Cu layer pattern 232 becomes a ball land on which the solder ball 218 is mounted.

If a metal pattern inserted between the metal wire 214 and solder ball 218 is a Cu layer, the metal wire 214 is formed of the same material as that of the metal pattern, i.e., Cu. The Cu layer pattern 232 helps to increase the contact area between the metal wire 214 and solder ball 218.

In the preferred embodiment of the present invention, the metal pattern is formed using a Cu layer. Alternatively, the metal pattern may be formed with other electrically conductive materials.

Figure 6G:
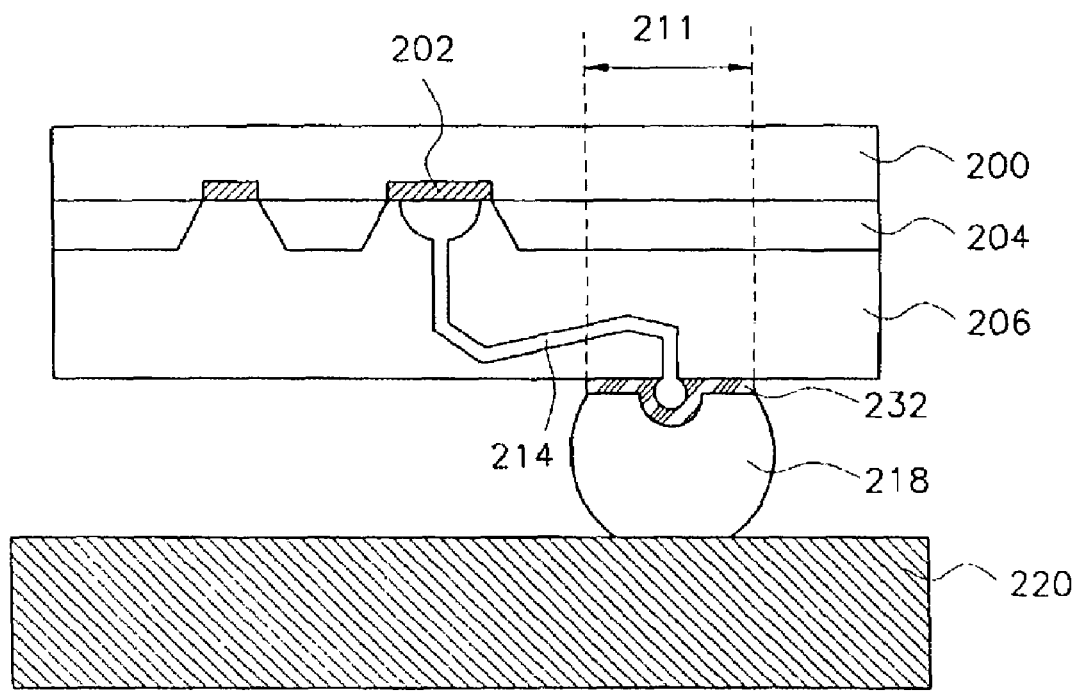

Referring to FIG. 6G, the solder ball 218 is mounted on a substrate 220, thereby finishing the package manufacturing process.

As mentioned in the above description, the present invention forms a metal wire, both of which ends are like cudgels, and then forms a solder ball at the metal wire, instead of forming a metal line by a deposition process using sputtering, as in the known methods. In this case, a Cu layer pattern may be inserted between the metal wire and the solder ball so as to increase the contact area between the metal wire and solder ball.

Accordingly, a chip-scaled package according to the present invention has the structure that the metal wire for electrical connection is sealed in the second insulating layer, thereby enabling easier control over the package thickness, reinforcing the bonding intensity of the metal wire and providing protection by the second insulating layer against a mechanical external forces. Thus, the present invention prevents deformation of the metal wire and improves its reliance, as well as prevents malfunctions of a chip caused by alpha particles.

Moreover, a manufacturing method according to the present invention electrically connects the chip pad and solder ball using a metal wire both of which ends are cudgel-shaped, thereby requiring no sputtering step. Thus, the method of the present invention simplifies the processing steps and also provides a light-thin-small sized package.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A chip-scaled package comprising:
   a semiconductor chip having a chip pad directly thereon;
   a first insulating layer formed on the semiconductor chip and having an opening part exposing the chip pad;
   a plurality of metal wires, one end of each wire connecting at least a portion the chip pad inside the opening part for providing electrical connection to the chip pad, and the other end of the wire being ball-shaped thereby increasing the contact area;
   a second insulating layer disposed on the first insulating layer completely filling the opening part including the end of the wire connecting the chip pad while exposing the whole ball-shape of the other end of metal wire;
   a conductive ball formed on the ball-shape of the other end of the metal wire; and
   a substrate for mounting the semiconductor chip thereon by means of the conductive ball.

2. The chip-scaled package of claim 1, wherein the second insulating layer is an epoxy or silicon rubber based sealing material.

3. The chip-scaled package of claim 1, wherein the second insulating layer has a thickness of from 250 to 300 $\mu$m.

4. The chip-scaled package of claim 1, wherein both ends of the metal wire are ball-shaped.

5. The chip-scaled package of claim 1, wherein a metal pattern is inserted between the other end of the metal wire and the conductive ball.

6. The chip-scaled package of claim 5, wherein the metal pattern is a Cu layer.

7. The chip-scaled package of claim 6, wherein the Cu layer has a thickness of from 5 to 10 $\mu$m.

8. The chip-scaled package of claim 1, wherein the metal wire is formed of Cu.

9. The chip-scaled package of claim 1, wherein the metal wire is formed of Au.

10. The chip-scaled package of claim 1, wherein the conductive ball further comprises a solder ball.

* * * * *